(12) United States Patent
Lu et al.

(10) Patent No.: US 6,711,812 B1
(45) Date of Patent: Mar. 30, 2004

(54) METHOD OF MAKING METAL CORE SUBSTRATE PRINTED CIRCUIT WIRING BOARD ENABLING THERMALLY ENHANCED BALL GRID ARRAY (BGA) PACKAGES

(75) Inventors: Jane Lu, Taipei (TW); Paul Wu, Saratoga, CA (US); Ray Chen, Fremont, CA (US); Scott Chen, Tao-Yuan (TW); Jeff Chang, Taoyuan (TW)

(73) Assignee: Unicap Electronics Industrial Corporation, Taipei (TW)

( * ) Notice: Subject to any disclaimer, the term of this patent is extended or adjusted under 35 U.S.C. 154(b) by 0 days.

(21) Appl. No.: 09/544,263

(22) Filed: Apr. 6, 2000

(Under 37 CFR 1.47)

Related U.S. Application Data

(60) Provisional application No. 60/128,948, filed on Apr. 13, 1999.

(51) Int. Cl.[7] .................................................. H01K 3/10
(52) U.S. Cl. .............................. 29/852; 29/830; 29/846; 427/97; 427/99; 428/901; 216/18; 174/262; 361/748.795
(58) Field of Search ......................... 29/830, 852, 846, 29/847; 427/96–99; 428/901, 209; 216/17–19; 438/644, 637, 675; 219/121.71, 121.7; 174/262; 361/795, 748, 792

(56) References Cited

U.S. PATENT DOCUMENTS

| | | | | |
|---|---|---|---|---|
| 3,401,126 | A | 9/1968 | Miller et al. ................. | 252/514 |
| 3,429,040 | A | 2/1969 | Miller ........................... | 29/626 |
| 3,436,818 | A | 4/1969 | Merrin et al. .................. | 29/626 |
| 3,564,522 | A | 2/1971 | Stevens, Jr. ............... | 340/174.1 |
| 3,949,125 | A | 4/1976 | Roberts ........................ | 428/99 |
| 4,229,248 | A | 10/1980 | Silverman et al. .......... | 156/653 |
| 4,462,534 | A | 7/1984 | Bitaillou et al. ............. | 228/180 |
| 4,504,283 | A | 3/1985 | Charvat ....................... | 51/298 |
| 4,546,541 | A | 10/1985 | Reid ............................ | 29/603 |
| 4,579,806 | A | 4/1986 | Schupp et al. .............. | 430/280 |
| 4,761,699 | A | 8/1988 | Ainslie et al. ............... | 360/103 |
| 4,818,728 | A | 4/1989 | Rai et al. ..................... | 437/209 |
| 4,825,284 | A | 4/1989 | Soga et al. ................... | 347/80 |
| 4,864,471 | A | 9/1989 | Hargasser et al. .......... | 361/417 |
| 4,996,623 | A | 2/1991 | Erpelding et al. .......... | 360/104 |
| 4,999,699 | A | 3/1991 | Christie et al. .............. | 357/65 |
| 5,121,190 | A | 6/1992 | Hsiao et al. .................. | 357/80 |
| 5,128,746 | A | 7/1992 | Pennisi et al. ............... | 357/72 |
| 5,334,857 | A | 8/1994 | Mennitt et al. .............. | 257/48 |
| 5,378,859 | A | 1/1995 | Shirasaki et al. ........... | 174/261 |
| 5,541,446 | A | 7/1996 | Kierse ......................... | 257/666 |
| 5,574,629 | A | 11/1996 | Sullivan ...................... | 361/767 |
| 5,796,159 | A | 8/1998 | Kierse ......................... | 257/668 |
| 5,844,308 | A | 12/1998 | Dedert et al. ............... | 257/692 |
| 6,083,340 | A | * 7/2000 | Nomura et al. ............. | 29/852 |

* cited by examiner

Primary Examiner—Peter Vo
(74) Attorney, Agent, or Firm—Jim Zegeer

(57) ABSTRACT

A method of making a thermally enhanced BGA substrate in which a metal (copper) core, has dielectric layers applied to each side thereof and conductive through-core build-up vias are provided. Rigidifying non-conductive dielectric sheets are laminated to the oppositely facing surfaces and then conductive layers are applied to at least one of the rigidifying non-conductive sheets and via connections are made through the dielectric layer(s) to the core conductive layer.

11 Claims, 5 Drawing Sheets

METHOD OF MAKING METAL CORE SUBSTRATE PRINTED CIRCUIT WIRING BOARD ENABLING THERMALLY ENHANCED BALL GRID ARRAY (BGA) PACKAGES

REFERENCE TO RELATED APPLICATION

The present application is based on provisional application Serial No. 60/128,948 filed Apr. 13, 1999 entitled METAL CORE SUBSTRATE ENABLING THERMALLY ENHANCED BALL GRID ARRAY PACKAGES.

DESCRIPTION OF THE PRIOR ART

Prolinx $C^2$BGA

The $C^2$BGAs are fabricated using a complicated etching donut isolation method, resulting in copper islands on the core that are suspended by some isolation material, and then followed by surface processing and photo via steps. The incurred cost for the complex steps and the resulting complex structure is significant.

SUMMARY OF THE INVENTION

The Ball Grid Array (BGA) is an advanced array package for fine pitch, high pin count semiconductor packaging, which is used normally in a multiple-layer chip-up printed wiring board (PWB) substrate for housing the integrated circuit structure in today's IC industry. However, the heat dissipation is a major concern with the arrival of high speed CPUs such as the Pentium II & III, as well as high speed graphics, networking, DSP, and programmable logic chips. Better thermal BGA packaging solutions are required to fulfill the need of IC products in the 21 century.

The object of this invention is to provide a new and simpler PWB structure and method with comparable or better thermal performance, resulting in lower cost and better reliability. High degree of flexibility in choice of material and layer counts and layer thickness allows for a wide range of applications in packaging and high density printed circuit board or PWB. The plated copper vias also allow for better thermal performance and result in better overall thermal performance for the resulting package.

The processing steps are also ones that have proven to be practical for implementing high density interconnect for packaging applications.

BRIEF DESCRIPTION OF THE DRAWINGS

The above and other objects, advantages and features of the invention will become more apparent when considered with the following description when taken in conjunction with the accompanying drawings in which like reference characters identify corresponding components or elements and wherein.

DETAILED DESCRIPTION OF THE INVENTION

Structure

Figure 1A:
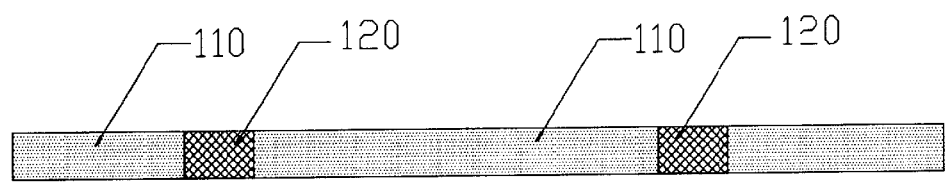
FIG. 1A shows, in section the initial metal core structure incorporating the invention.
Figure 1B:
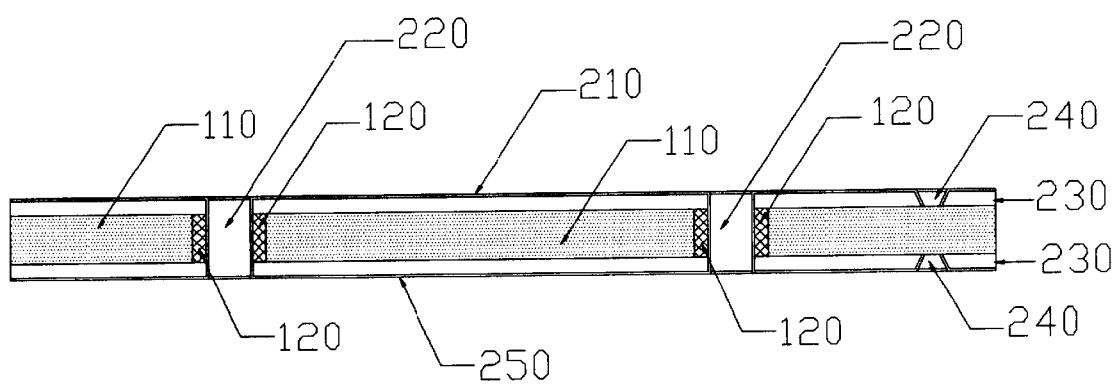
FIG. 1B shows the metal core structure after the addition of two additional functional layers on respective glass fiber layers, incorporating the invention.
Figure 1C:
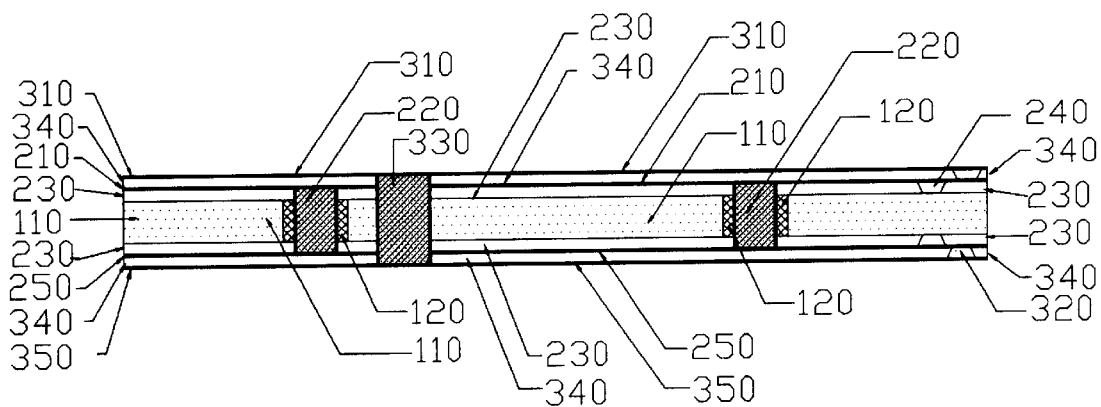
FIG. 1C shows a five-layer structure incorporating the invention.
Figure 1D:
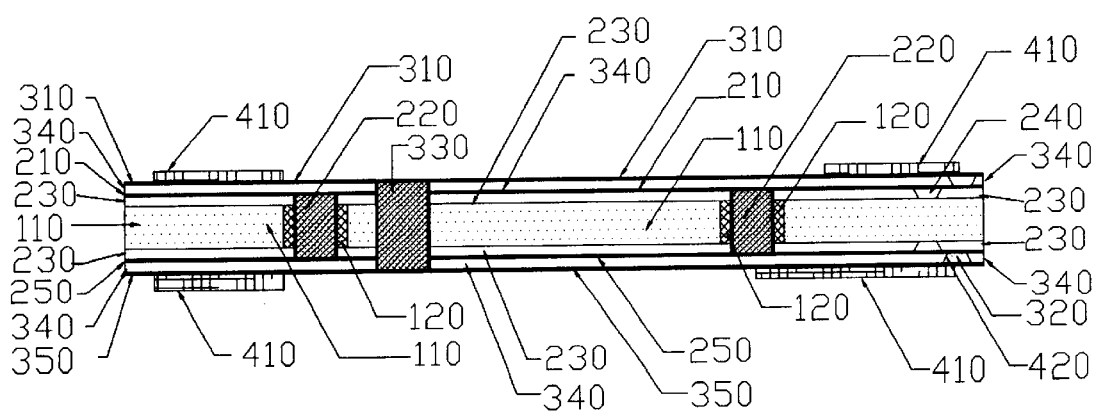
FIG. 1D shows the use of a solder mask coating on the structure of FIG. 1C.

FIG. 1A shows the structure during the initial metal core 110 forming stage. FIG. 1B shows the structure after the first two build up layers 120 are fabricated. FIG. 1B shows two drilled Plated Through Holes (PTH) 220 in the structure. It can be the complete PWB structure if a 3-layer structure 210-110-210 is desired, which is simpler and less costly. Please note that the ⅓ oz copper foil 210 and the 5–10 oz copper core 110 are separated with insulating glass fiber prepreg layers 230. Also the blind or laser drilled & plated via 240 is used for connecting to the core 110 as ground. The five-layer structure in FIG. 1C is intended for more complex and high density applications. FIG. 1C shows two extra build-up layers 310, with build-up vias 320, and a PTH 220. In the following discussion, we will focus on the five-layer structure depicted in FIG. 1C, which includes three distinct types of vias implemented in the invention.

Figure 2:
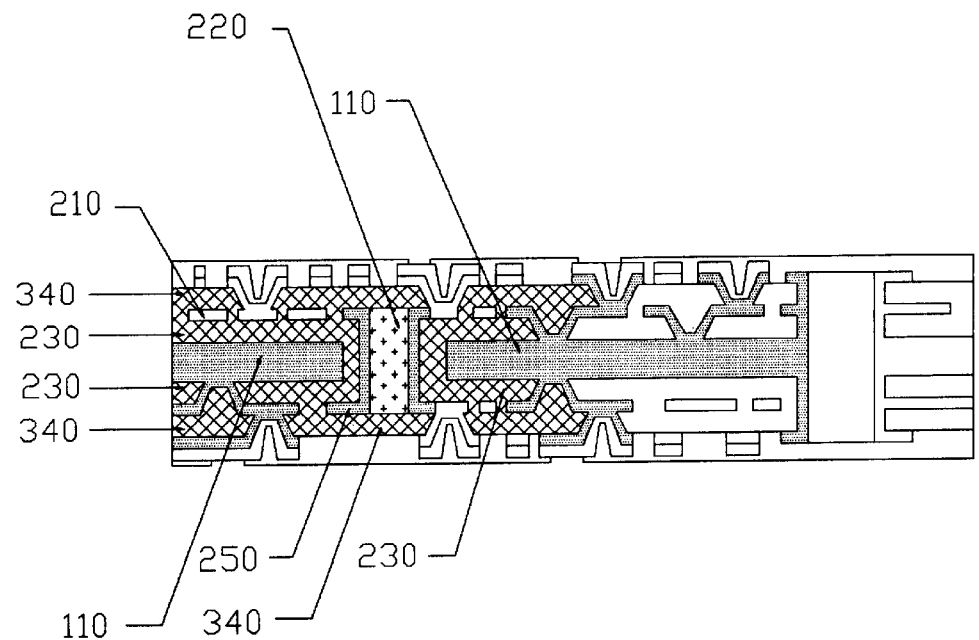
FIG. 2 illustrates a type 1 via according to the invention.

Type 1 via 220 as illustrated in FIG. 2, is for implementing the majority of the vias in the structure also shown in FIG. 1B, FIG. 1C. It is isolated from the core and is connected to the outer layers through build-up vias 320 that are either laser drilled or controlled depth mechanically drilled.

Figure 3:
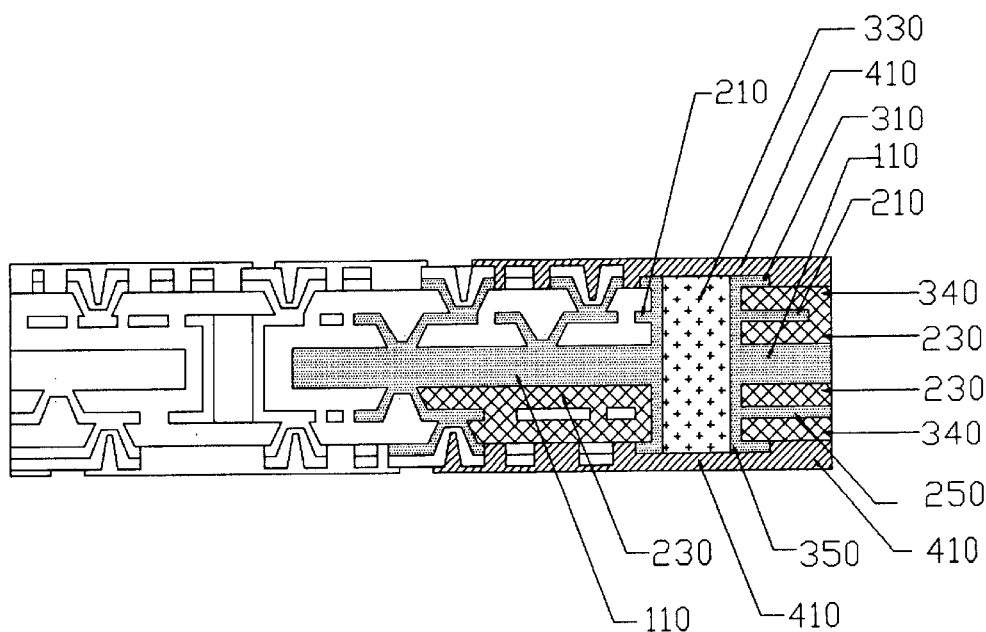
FIG. 3 illustrates a type 2 via according to the invention.

Type 2 via, as illustrated in FIG. 3, is a via that is connected with the core, which is typically used as a ground plane. It is implemented by a through hole drill 330 directly on the core 110 and followed by plating, which results in side-wall connection with the core.

The advantage of the type 2 via is that it provides a direct thermal transfer path from the top layer 310 to the core 110 and then to the bottom layer 350, ideal for implementing thermal vias in packaging applications.

The only drawback with type 2 via is that the side-wall plating has interface with various layers including the core 110 and the prepreg 230, as well as with the interface between the conductive layers 210, 310 and the prepreg, which if not properly processed, will contain micro-cracks that allow moisture to penetrate through. The micro-cracks may result in delamination of the interface between the core 110 and the prepreg 230.

Figure 4:
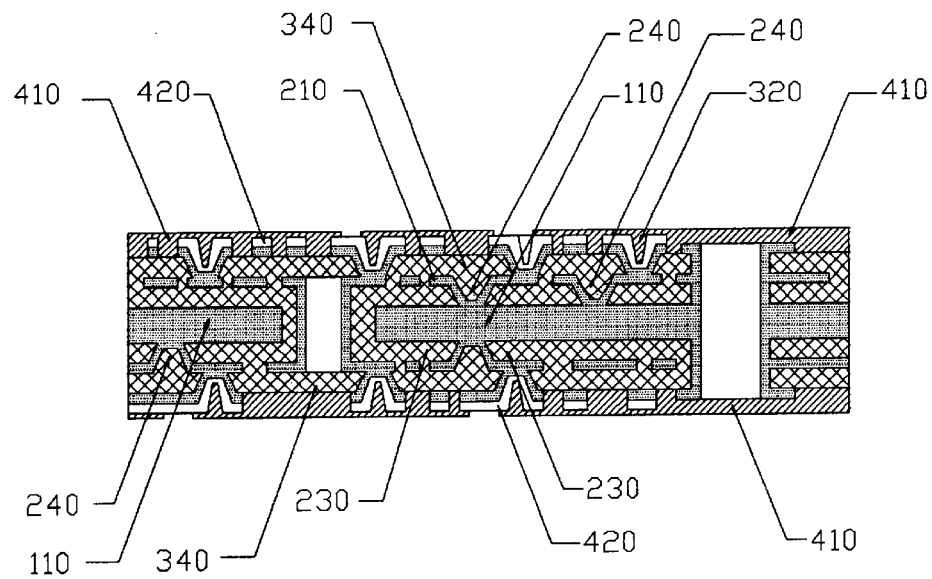
FIG. 4 illustrates a type 3 via according to the invention.
Figure 5:
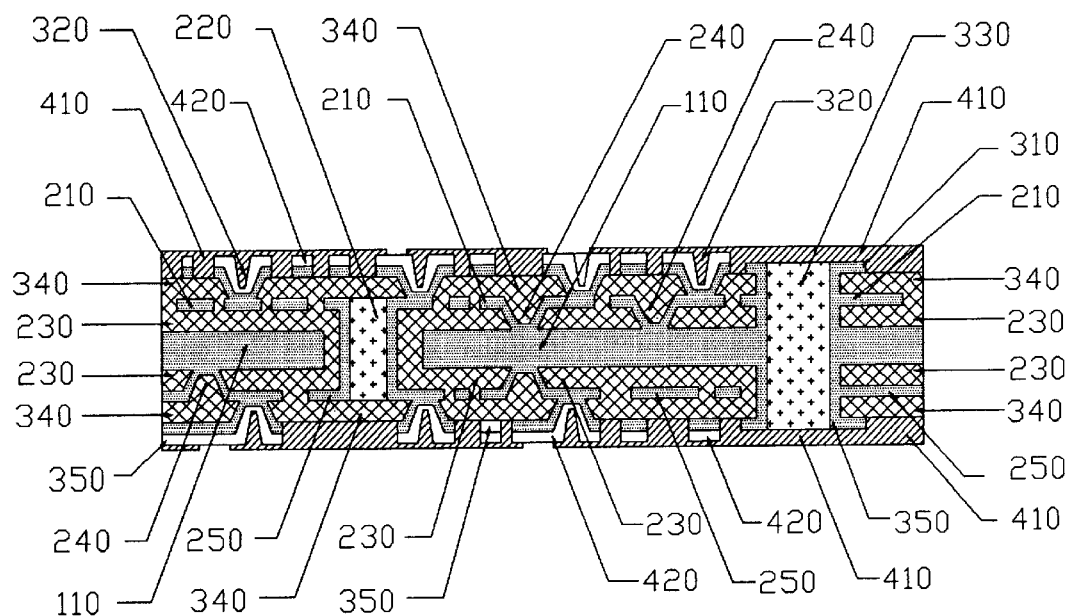
FIG. 5 illustrates a sectional view of an overall structure incorporating the invention.
Figure 6:
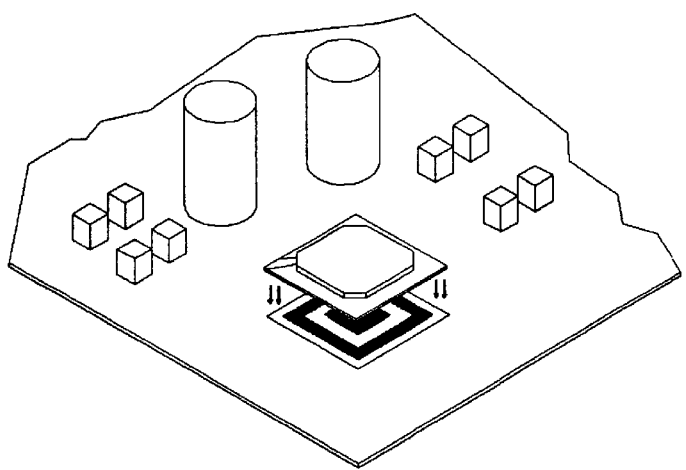
FIG. 6 is a perspective view of a finished BGA IC package with a substrate incorporating the invention, mounted on a PWB which can either be of a conventional laminated board or one that incorporates the invention.

Type 3 via, as illustrated in FIG. 4, is also a via that connects to the ground plane on the core 110, and also provides good thermal path to the core 110. It is implemented by build-up core vias 240 and 320 through laser or controlled depth drill, also shown in FIG. 1B and FIG. 1C. It is good for thermal performance and does not have the reliability drawback as does the type 2 via.

Materials

The preferred choice of the metal core 110 is copper C194 foil of 5–10 oz, or 5–15 mils thickness, as shown in FIG. 1A. The liquid to plug the metal core holes 120 can be PHP900 or equivalent materials.

The inner prepreg 230 is either BT (bismaleimide triazine) or 47N with glass fiber, of 1.5 to 3 mil thickness.

The glass fiber ingredient allows for structural enhancement against thermal expansion coefficient mismatch between the metal core 110 and the prepreg material 230.

The outer prepreg 340 can be either B.T. or R.C.C. (Resin-Coated-Copper) material, typically used for laser-drilled build-up. The thickness of the outer preg 340 is also within the range of 1.5 to 3 mils. The copper foil 210 used in the non-core layers can be of ⅓ oz thickness, though a wide thickness range is appropriate (⅛, ¼, or ½ oz) for various applications.

Process

The following describes a preferred process step sequence, though variations can be adopted by those familiar with the art of printed circuit board and HDI (high density interconnect) fabrication.

1. Starting with the metal core 110, drill or etch holes at the through-core vias sites, as shown in FIG. 1B and FIG. 1C, with hole sizes around 25 mils (15 mil to 40 mils is the allowable range for BGA applications). Note that typical panel sizes are 12"×18", or 18"×24", or variations hereof. Black oxide processing is performed on the metal surface for better adhesion to the laminated prepreg layer 210, 230 310, 250 and 340.

Singulation lines at the border of each substrate unit can be pre-drilled or pre-etched, during the first via drill-etch step, for easy singulation in strip or singulated delivery format.

2. Liquid (PHP900) plug the holes 120 (as the hatched areas shown in FIG. 1A). In the case of a thinner core 110, such as around 5 mils, the liquid plugging 120 may not be necessary, as the inner prepreg 230 will naturally flow and fill the holes during lamination. For thick cores, it is better to plug the holes first.

3. Prepreg laminations 230 and 340.

For example, 3-mil prepregs with ⅓ oz copper foil is used in FIG. 1C. Note that for the reason of maintaining symmetry, one prepreg layer for each of the top and the bottom side is laminated at the same time.

4. Drill holes for the through vias isolated from the core. The diameter of the drill is about 10 mils laser drill or controlled-depth mechanical drill for vias that are to be connected to the core, with the diameter in the range of 2 mils to 6 mils, as shown in FIG. 1B. Note that the liquid plugging material 120 which is the prepreg that flows into the first drill hole in step 2, isolates the plated vias 220 from the core 110.

5. Transfer inner layers 210 and 250 images to form pads and trace circuitry.

6. Laminate outer prepreg layers 310 and 340 with BT or R.C.C. material. If a 3-layer only structure is desired, the outer prepreg layers 310 and 340 are not needed. With the same principle, if a 4-layer only structure is desired, then the bottom BT or R.C.C. layer is not required.

7. Form build-up via holes 320 by Laser hole drill or controlled-depth mechanical drill.

8. Mechanical through hole drill for type 2 via 330 if desired.

9. Plating copper 310 and 350 for through hole vias and panel plating.

10. The rest of the steps depend on Ni/Au plating technology and application needs. This includes imaging transfer for outer layers and Ni/Au plating 420.

11. Solder mask 410 coating, as shown in FIG. D.

12. Finishing: Singulating the panel into individual units or into strips for packaging assembly.

Advantages

1. Efficient symmetric layer and via structures for high thermal conductance.
2. Achieving same or better thermal performance comparing to prior art, with mature processing technology and proven materials.
3. Requires only incremental cost increase for offering better performance than Plastic Ball Grid Array (PBGA).

FEATURES OF THE INVENTION

1. New copper-core based structure for chip-up high thermal performance package using 3-layer (core+1-top+1-bottom), 4-layer (core+2-top+1-bottom), and 5-layer (core+2-top+2-bottom). Moreover, 5 or more layers can be built easily. The 3-and 5-layer options are symmetric, with better warpage prevention.
2. The use of drilling/etching, optional liquid-filled, laminating, drilling, and plating process steps for forming the through core via holes.
3. The combination of laser blind vias build-up on top of the metal core structure, enabling additional build-up layers for high density applications.
4. Efficient thermal vias by plating build-up and connecting to the core from both the top and bottom sides.
5. Singulation lines at the border of each substrate unit can be pre-drilled or pre-etched, during the first via drill-etch step, for easy singulation in strip or singulated delivery format.
6. Applications: a) Metal core based substrates for thermally enhanced fine-pitch BGAS, and b) Metal core based high density boards such as for high thermal output SDRAM DIMM modules.

While the invention has been described in relation to preferred embodiments of the invention, it will be appreciated that other embodiments, adaptations and modifications of the invention will be apparent to those skilled in the art.

What is claimed is:

1. A method of making a thermally enhanced printed circuit wiring board substrate for ball grid integrated circuit packages comprising the steps of:

a) providing an initial thin conductive metal core having oppositely facing surfaces, b) forming one or more holes in said metal core at each of a plurality of through-core via sites, c) laminating a thin rigidifying non-conductive dielectric sheet to each said oppositely facing surfaces, respectively, d) forming at least one via to said metal core in one of said dielectric sheets, e) applying at least one thin conductive layer on a surface of one of said thin rigidifying non-conductive sheets and making at least one electrical connection to said initial thin conductive metal core at said at least one via to said metal core.

2. The method defined in claim 1 further including a step of making one or more of Type 1 vias at said one or more through-core via sites.

3. The method defined in claim 1 further including a step of forming one or more Type 2 vias at said one or more through-core via sites.

4. The method defined in claim 1 further including a step of forming one or more Type 3 vias at one or more said metal core vias.

5. The method defined in claim 2 further including a step of forming one or more Type 2 or Type 3 vias at said one or more through-core via sites.

6. The method defined in claim 4 wherein said Type 3 via of is isolated from said core and connected to the thin conductive layer.

7. The method defined in claim 3 wherein said Type 2 vias are made by through-hole plating directly to said core and followed by plating resulting in sidewall connection with the core.

8. The method defined in claim 1 wherein said plurality of through-core via sites are drilled, plated through-holes (PTH).

9. The method defined in claim 1 wherein said through-core vias are made by printing build-up and connection to the core in the opposite facing surfaces.

10. A method of making a thermally enhanced printed circuit wiring board substrate for ball grid integrated circuit packages comprising the steps of:

a) providing an initial thin conductive metal core having oppositely facing surfaces, b) forming one or more holes in said metal core at each of a plurality of through-core via sites, c) laminating a thin rigidifying non-conductive dielectric sheet to each said oppositely facing surfaces, respectively, so that at least one exposed surface of the non-conductive dielectric sheet facing outwardly, respectively, d) applying at least one thin conductive layer on said at least one exposed surface of non-conductive dielectric sheet, and e) forming a conductive connection between said thin conductive layer on said surface through one of said through-core via sites.

11. The method defined in claim 10 further including forming at least one via to said metal core in at least one of said dielectric sheets, and making at least one electric connection to said initial thin conductive metal core at said at least one via to said metal core.

* * * * *